United States Patent
Belfield

(10) Patent No.: US 7,608,384 B1
(45) Date of Patent: *Oct. 27, 2009

(54) TWO-PHOTON FLUORESCENT TERNARY OPTICAL DATA STORAGE

(75) Inventor: Kevin D Belfield, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 865 days.

This patent is subject to a terminal disclaimer.

(21) Appl. No.: 10/821,755

(22) Filed: Apr. 9, 2004

Related U.S. Application Data

(63) Continuation-in-part of application No. 10/306,960, filed on Nov. 27, 2002, now Pat. No. 7,001,708.

(51) Int. Cl.
G11B 7/24 (2006.01)

(52) U.S. Cl. .................. 430/270.15; 430/945; 430/269; 428/64.4; 428/64.7; 428/64.8; 369/286; 369/288

(58) Field of Classification Search .................. None
See application file for complete search history.

(56) References Cited

U.S. PATENT DOCUMENTS

| | | | | |
|---|---|---|---|---|
| 3,413,071 | A * | 11/1968 | Davis | 8/467 |
| 4,341,860 | A * | 7/1982 | Sysak | 430/277.1 |
| 5,484,682 | A * | 1/1996 | Iwakura et al. | 430/138 |
| 6,071,671 | A * | 6/2000 | Glushko et al. | 430/270.15 |
| 6,212,148 | B1 * | 4/2001 | Hesselink et al. | 369/103 |
| 6,267,913 | B1 * | 7/2001 | Marder et al. | 252/582 |
| 6,316,153 | B1 * | 11/2001 | Goodman et al. | 430/8 |
| 6,432,610 | B1 * | 8/2002 | Rentzepis et al. | 430/270.15 |
| 6,608,228 | B1 * | 8/2003 | Cumpston et al. | 564/308 |
| 7,001,708 | B1 * | 2/2006 | Belfield | 430/280.1 |
| 2003/0027063 | A1 * | 2/2003 | Fourkas et al. | 430/19 |
| 2003/0073031 | A1 * | 4/2003 | Rentzepis et al. | 430/270.15 |

FOREIGN PATENT DOCUMENTS

WO     01/96952     * 12/2001

(Continued)

OTHER PUBLICATIONS

Belfield et al. "Three dimensional two photon imaging in polymeric materials" Proc. SPIE vol. 4459 pp. 281-289 (Jan. 2002).*

(Continued)

*Primary Examiner*—Martin J Angebranndt
(74) *Attorney, Agent, or Firm*—Brian S. Steinberger; Joyce P. Morlin; Law Offices of Brian S. Steinberger, P.A.

(57) ABSTRACT

Ternary optical data storage method and apparatus for Write Once Read Many Times (WORM) optical data storage with two-photon fluorescent writing and readout. The data storage capacity is limited by the optical resolution of a system. In CD/DVD systems, an increase in the aerial data density has been primarily achieved by decreasing the bit dimension. However, the size of the optical spot (bit) is restricted by limitations imposed by the diffraction of light (Rayleigh criterion). Therefore, technologies that can effectively create and detect spot sizes beyond the diffraction limit (sub-Rayleigh) hold promise to achieving high-density optical storage.

15 Claims, 4 Drawing Sheets

1
$\lambda_{max}$ absorption = 390 nm
$\lambda_{max}$ emission = 490 nm

H$^+$ →

2
$\lambda_{max}$ absorption = 500 nm
$\lambda_{max}$ emission = 625 nm

FOREIGN PATENT DOCUMENTS

WO           01/96959     * 12/2001

OTHER PUBLICATIONS

Tanaka et al. "Rapid sub-diffraction limit laser micro/nano processing in a threshold material system", Appl. Phys. Lett., vol. 80(2) pp. 312-314 (Jan. 2002).*

Bhawalkar et al. "Two photon laser scanning fluorescence microscopy . . . ", Bioimaging vol. 4 pp. 168-178 (1996).*

"*Multiphoton-absorbing organic materials for microfabrication, emerging optical applications and non-destructive three-dimensional imaging,*" Kevin D. Belfield, et al., Journal of Physical Organic Chemistry, 2000; 13: 837-849.

"*Synthesis of New Two-Photon Absorbing Fluorene Derivatives via Cu-Mediated Ullmann Condensations,*" Kevin D. Belfield, et al., The Journal of Organic Chemistry, vol. 65, No. 15, Jul. 28, 2000, pp. 4475-4481.

"*A New Photosensitive Polymeric Material for WORM Optical Data Storage Using Multichannel Two-Photon Fluorescence Readout,*" Kevin D. Belfield, et al., Chem. Mater., vol. 14, No. 9, 2002, pp. 3656-3662.

* cited by examiner

NFO: Near-field Optics; SIL: Solid Immersion Lens

TWO-PHOTON FLUORESCENT TERNARY OPTICAL DATA STORAGE

This invention is a Continuation-In-Part of U.S. application Ser. No. 10/306,960 filed Nov. 27, 2002, now U.S. Pat. No. 7,001,708 that issued on Feb. 21, 2006, which claims the benefit of priority based on U.S. Provisional application No. 60/339,283 filed Dec. 11, 2001 and U.S. Provisional application No. 60/333,972 filed on Nov. 28, 2001, and this invention further claims the benefit of priority based on U.S. Provisional Application No. 60/463,426 filed Apr. 16, 2003.

FIELD OF THE INVENTION

This invention relates to optical data storage and more particularly to a ternary optical data storage methods and apparatus and systems for Write Once Read Many times (WORM) optical data storage with two-photon fluorescent writing and readout.

BACKGROUND AND PRIOR ART

Over the past 50 years, the field of organic photochemistry has produced a wealth of information, from reaction mechanisms to useful methodology for synthetic transformations. Many technological innovations have been realized during this time due to the exploits of this knowledge, including photoresists and lithography for the production of integrated circuits, photocharge generation for xerography, multidimensional fluorescence imaging, photodynamic therapy for cancer treatment, photoinitiated polymerization, and UV protection of plastics and humans through the development of UV absorbing compounds and sunscreens, to name a few.

The scientific basis of many of these processes continues to be utilized today, particularly in the development of organic three-dimensional optical data storage media and processes.

It is known that fluorescent properties of certain fluorophores may be changed (quenched) upon protonation by photogeneration of acid Two-photon induced photoacid generation using onium salts and short pulsed near-IR lasers in the presence of a polymerizable medium has been reported, resulting in two-photon photoinitiated cationic polymerizations The inherent three-dimensional features associated with two-photon absorption provides an intriguing basis upon which to combine spatially-resolved, two-photon induced photoacid generation and fluorescence quenching with two-photon fluorescence imaging The quadratic, or nonlinear, dependence of two-photon absorption on the intensity of the incident light has substantial implications (dw/dt oc $I^2$). For example, in a medium containing one-photon absorbing chromophores significant absorption occurs all along the path of a focused beam of suitable wavelength light. This can lead to out-of focus excitation. In a two-photon process, negligible absorption occurs except in the immediate vicinity of the focal volume of a light beam of appropriate energy. This allows spatial resolution about the beam axis as well as radially, which circumvents out-of-focus absorption and is the principle reason for two-photon fluorescence imaging. Particular molecules can undergo upconverted fluorescence through nonresonant two-photon absorption using near-IR radiation, resulting in an energy emission greater than that of the individual photons involved (upconversion). The use of a longer wavelength excitation source for fluorescence emission affords advantages not feasible using conventional UV or visible fluoresence techniques, e.g., deeper penetration of the excitation beam and reduction of photobleaching, and is particularly well-suited for fluorescence detection in multilayer coatings.

Rentzepis et al. reported two-photon induced photochromism of spiropyran derivatives at 1064 nm. Analogous to single-photon absorption facilitated isomerizion, the spiropyran underwent ring-opening isomerizion to the zwitterionic colored merocyanine isomer. The merocyanine isomer underwent two-photon absorption at 1064 nm, resulting in upconverted fluoresence. However, spiropyrans are known to undergo photobleaching and photodegradation upon prolonged exposure, and hence are not suitable for long-term use. Nonetheless, an intriguing model for 3-D optical storage memory was proposed. An intriguing bacteriorhodopsin-based holographic recording media and process, using two-photon excitation, has been reported by Birge et al.

The synthesis and characterization of organic fluorescent dyes with high two-photon absorptivity has been reported. Several of these dyes also undergo substantial changes in the absorption and fluorescence spectral properties in the presence of strong acid, i.e., they undergo protonation, affording changes in their polarizability, absorption and emission maxima and fluorescence quantum yields.

With the ever-pressing demand for higher storage densities, researchers are pursuing a number of strategies to develop three-dimensional capabilities for optical data storage in organic-based systems. Among the various strategies reported are holographic data storage using photopolymerizable media photorefractive polymers, and two-photon induced photochromism, to mention a few.

In light of the foregoing, there is a need for an increased density of data storage, particularly for CD/DVD systems.

SUMMARY OF THE INVENTION

It is a primary objective of the invention to develop increased data storage capacity of CD/DVD systems.

Another object of the invention is to develop increased data storage capacity of optical systems using ternary optical systems.

A further object of the invention is to produce a system of high density data storage that can create and detect optical spot (bit) sizes beyond the diffraction limit (sub-Rayleigh).

A preferred embodiment of the invention is the method of writing data in a ternary WORM (Write Once Read Many Times) optical data storage with two-photon fluorescent readout comprising the steps of:

(a) providing a data storage medium composed of a transparent polymer impregnated with a photo-acid generator and a reactive dye;

(b) focusing a near infrared tunable laser into the storage medium with high intensity short pulses; and (c) absorbing the high intensity short pulses in the photo-acid generator to form a data storage voxel (volume pixel).

A further preferred embodiment of the invention includes a method of reading data from a ternary WORM (Write Once Read Many Times) optical data storage with two-photon fluorescent encoded data comprising the steps of:

(d) providing a data storage voxel (volume pixel) containing a photo-acid generator and a reactive dye;

(e) exciting the reactive dye with a plurality of light sources to generate fluorescent values;

(f) measuring intensity values of each of the fluorescent values; and (g) reading differences in the intensity values to determine data in the data storage voxel.

Further objects and advantages of this invention will be apparent from the following detailed descriptions of presently preferred embodiments which are illustrated schematically in the accompanying drawings.

BRIEF DESCRIPTION OF THE FIGURES

FIG. 9 (b) shows two photon fluorescent images of photosensitive films developed (via 350 nm broadband exposure, 4.4 mW/cm$^2$) using an Air Force resolution target mask which is the image recorded by channel 2.

FIG. 9 (c) shows two photon fluorescent images of photosensitive films developed (via 350 nm broadband exposure, 4.4 mW/cm$^2$) using an Air Force resolution target mask which is the image recorded of fluorescence intensity by scanning an x-y line across one set of three-member elements (yellow line across set 5).

DESCRIPTION OF THE PREFERRED EMBODIMENTS

Before explaining the disclosed embodiments of the present invention in detail, it is to be understood that the invention is not limited in its application to the details of the particular arrangements shown since the invention is capable of other embodiments. Also, the terminology used herein is for the purpose of description and not of limitation.

The innovation disclosed herein is a three-dimensional storage system that relies on a ternary data encoding scheme to achieve high data storage densities. The absolute fluorescence emission intensity recorded by one channel will be used to read a "0" or "1" with an appropriate threshold set. This will provide binary encoding. The ratio of fluorescence emission detected by each of two channels (set to record the emission at different wavelength regions corresponding to two different species in the recording medium) will be writing intensity dependent and will provide the "2" for "0", "1", and "2" ternary data encoding. The ternary data encoding is expected to increase data storage density by approximately 50%. Thus, this technology combines all of the three-dimensional (3-D) spatially-resolved and deep writing/readout advantages associated with two-photon excitation writing and two-photon fluorescence readout with the innovation made possible using these particular types of materials for ternary data encoding.

Figure 1:
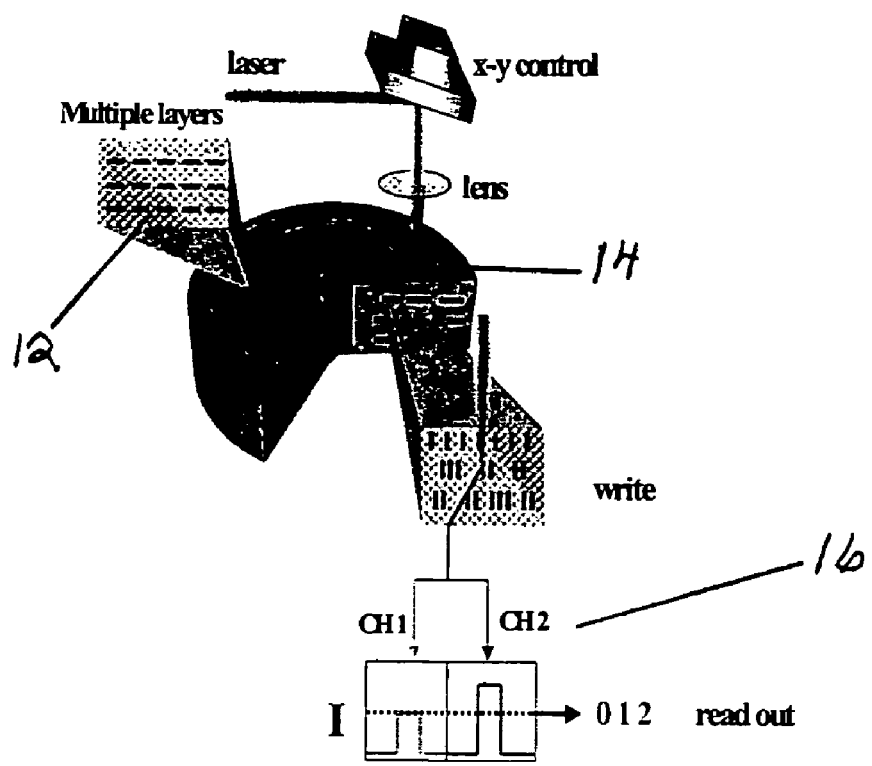
FIG. 1 shows conceptualized illustration of terabit/in$^2$ optical storage using ternary encoding 2-photon technology.

The technique proposed does not require the near field optics to achieve the sub-diffraction limited feature size. The system of the invention will achieve sub-diffraction feature size through intensity dependent 2-photon processes. FIG. 1 illustrates the conceptual design of the 2-photon write/read system. The data is encoded in multiple layers 12, allowing data to be encoded with x, y, and z spatial coordinates. The 0-1-2 ternary code provides the potential to increase the storage densities by approximately 50% relative to binary two-photon based technologies. Since the overall x-y storage area is fixed in the CD/DVD disk 14 format at 120 mm (4.72 in) in diameter, more storage can be created on multi-layers in depth providing the ternary encoding two-photon sensitive storage. Data storage of up to 1 terabit/in$^2$ can be achieved with multi-layer spacings of 30 μm.

The concept of this invention is a multilayer data storage system of at least approximately five layers based on two-photon induced recording and two-photon fluorescence readout technology that consists of a ternary data-encoding scheme. Using a high numerical aperture (NA) objective lens, spatial resolution on the order of 120 nm is possible. This invention utilizes materials and processes disclosed for Belfield's previous binary write-once read-many (WORM) three-dimensional (3-D) optical data storage invention for which a U.S. patent application Ser. No. 10/306,960 was filed on Nov. 27, 2002, now U.S. Pat. No. 7,001,708 issued Feb. 21, 2006 with a common assignee and by reference thereto is fully incorporated herein. In this approach, photoinduced fluorescence changes in a polymeric medium are employed to a WORM data storage medium with two-photon fluorescence readout. Both image writing and reading will be accomplished via near-IR two-photon excitation of polymer films containing a fluorophore and photoacid generator (PAG). Furthermore, rather than using the previously disclosed binary encoding scheme, a ternary encoding scheme will be utilized, increasing the data storage capacity by 50%.

Table 1 appearing hereafter summarizes the current state-of-the-art in optical data storage disks (CD-ROM and red DVD), and on a third in development (blue 2-layer DVD.

TABLE 1

Storage Details for State of the Art Optical Storage Disks
Disk Diameter = 120 mm = 4.72 in.
DVD Hub = 0.85 in
CD Hub = 1.81 in; Active Area = 14.0 in$^2$
Active Area = 16 in$^2$, 2 Layers Thickness = 1 mm.

| Format | Gbytes Per Format | Gbits/in$^2$ | Bits/μm$^2$ | Bit and Land Area (μm)$^2$ | Bit and Land Width (μm) |
|---|---|---|---|---|---|
| CD ROM 1 Layer | 0.600 | 0.344 | 0.533 | 1.87 μ2 | 1.370 |
| Red DVD 1 Layer | 4.7 | 2.34 | 3.63 | 0.275 | 0.524 |
| DVD 2-Layer | ~10 ~5 per layer | 5.0 2.5 per layer | 7.75 3.87 per layer | 0.129 0.258 per layer | 0.507 per layer |

Figure 2:
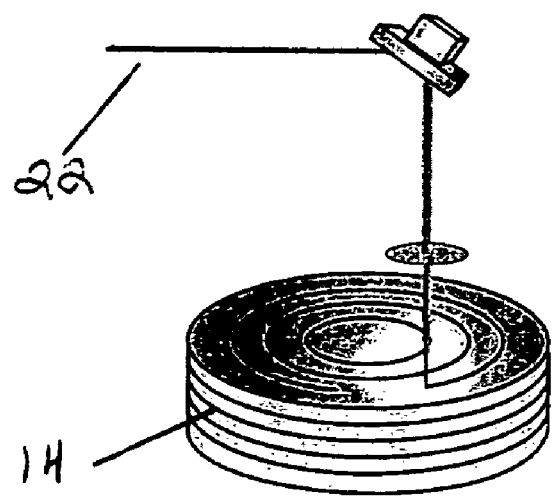
FIG. 2 shows two-Photon write/read systems involves a near-IR laser and a multilayered optical storage disk.

Gbits/in$^2$ = [Gbytes/Format] × 8 (bits/byte)/Format area (in$^2$)
Bits/μm$^2$ = [Gbits/in$^2$] × 1.55 × 10$^{-9}$ (in$^2$/μm$^2$)
Bit and Land Area (μm$^2$) = [1/Bits/μm$^2$]
Bit and Land width (μm) = Square Root Bit Area Writing and Reading Optical Data The write/read system using the two-photon technology is a five-part process. Part one involves the creation of the data storage medium; Parts two and three entail the data writing process; while Part four and five comprise the data reading process. The process is conducted using a focused near-IR laser beam 22 to write and read data from a multilayered optical disk 14 (FIG. 2).

The recording medium is cast from a transparent polymer (polystyrene, PMMA, or polycarbonate) impregnated with a photosensitive Photo-Acid Generator (PAG) (commercially available "onium salt" that is currently used in photolithography) and a reactive dye (RD) (a stable fluorene dye).

Figure 3:
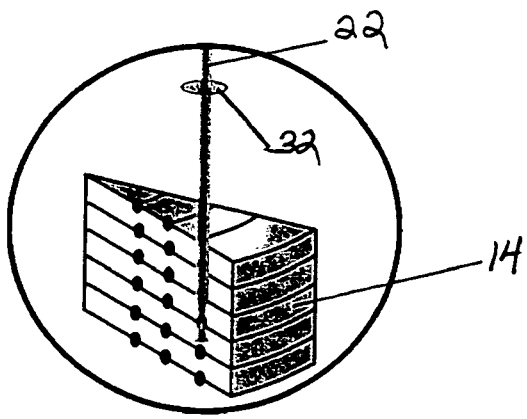
FIG. 3 shows irradiation of storage media with 730 nm laser light creates Photoacid generator (PAG−) and Reactive dye (RD+).

In Part two, a near infra-red tunable Ti:Sapphire (Clark-MRX or Mira) laser beam 22 is focused into the storage medium 14 with a high intensity, short pulse at 730 nm (FIG. 3). The depth of focus of the lens 32 for the laser beam 22 is able to be adjusted, yield the three-dimensional ability for data storage using this technique. The minimum spot size of the focused laser beam is the "diffraction limit" (DL) of the lens, also called the Rayleigh criterion limit, the "circle of confusion", or the Airy disk. The $DL=(\alpha/NA)$, where $\alpha$ is the recording wavelength and the NA is the numerical aperture of the focusing lens. It is proposed to utilize an NA=1.4 to produce a smaller DL=approximately 520 nm. The photosensitive PAG molecules and the reactive dye (RD) in medium do not absorb 1-photon 730 nm IR light at modest intensity (I), thus, allowing the approximately 730 nm photons to penetrate into the medium until the strength of the intensity squared ($I^2$) is very high. If ultraviolet light of (approximately 365 nm) was utilized, it would enter the medium, be absorbed by the PAG to make excited PAG+, and also be absorbed by the polymer medium. This would prevent the deep penetration needed for multi-layer storage. The theory and practice of 2-photon absorption is that when the squared intensity ($I^2$) is high enough, the PAG will absorb 2-photons at approximately 730 nm that will have the same energy as 1-photon at approximately 365 nm, and will be excited to PAG+. Because excitation by 2-photon absorption depends on $I^2$ rather than being linear with (I), the 2-photon excitation is designated a "nonlinear optical" (NLO) effect. The sequences of reactions following 2-photon absorption by PAG are shown in Table 2:

| | | |
|---|---|---|
| PAG + 730 nm (2-photon) | → | PAG+ [proportional to ($I^2$)] |
| PAG+ | → | $H^+$ (acid) + PAG⁻ (negative counterion) |
| RD (Reactive Dye – fluorene) * + $H^+$ | → | $RD^+$ (protonated fluorine), the Fluorescence Emitter (FE) |

PAG is excited to PAG+. The PAG+ yields a proton ($H^+$) and donates it to RD, leaving PAG⁻, which is a stable negative counter-ion. RD becomes $RD^+$, which is the protonated fluorene dye, a Fluorescence Emitter (FE).

Figure 4:
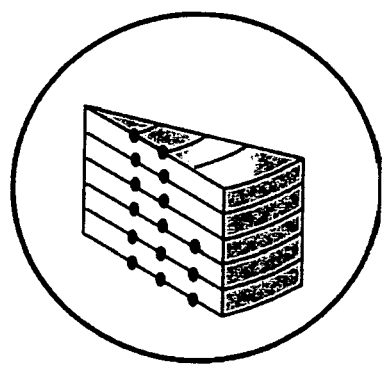
FIG. 4 shows stable ion pair data storage "voxel" formed.

The third part (FIG. 4) of the process is the formation of the stable balanced ion pair from the negative counter-ion, PAG⁻, and the positive $RD^+$. The stable ion pairs make-up the data storage "voxel" (volume pixel) in the medium. At this point of the process, the data has been encoded into the medium.

Figure 5:
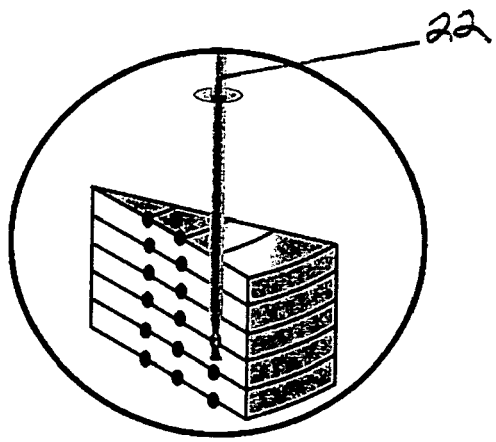
FIG. 5 shows voxel is irradiated with 800 nm laser light.

In Part 4 (FIG. 5), the laser beam 22 is retuned for data reading. Readout is performed by stimulating the fluorescence of FE and RD using a 2-photon laser light pulse (approximately ~10 μs), thus ensuring deep penetration of the light to the desired depth. Since stimulation with approximately 730 nm light would excite more PAG and create more FE during reading, thus convolute the fluorescence readout, an approximately 800 nm light is used. Approximately 800 nm light will cause fluorescence of both FE and RD without exciting more PAG.

Figure 6:
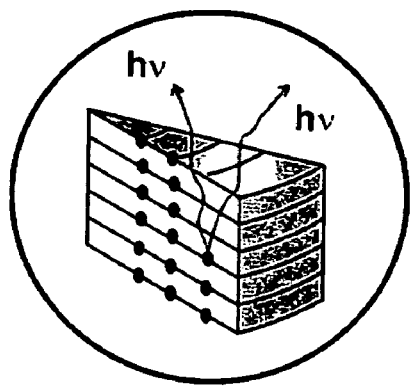
FIG. 6 shows voxel fluoresces at two wavelengths, 650 nm and 530 nm.

In Part 5 (FIG. 6), the FE and RD, fluoresces at approximately 650 nm and approximately 530 nm, respectively.

These two fluorescent output signals (lasting for ~5 ns) give a unique advantage in data storage. These signals allow the reading of 3 pieces (ternary) rather than 2 pieces (binary) of information from each bit. This gives us a potential advantage of (3/2) or approximately 50% more data storage from the same number of bits over a binary system. As shown in FIG. 1, Channel 2 16 (red from FE) produces "0" and "1", while Channel 1 18 (green from RD) is taken as a ratio of the intensity of channel 1 to channel 2 to give the third bit noted as "2".

High Density Data Storage

Figure 7:
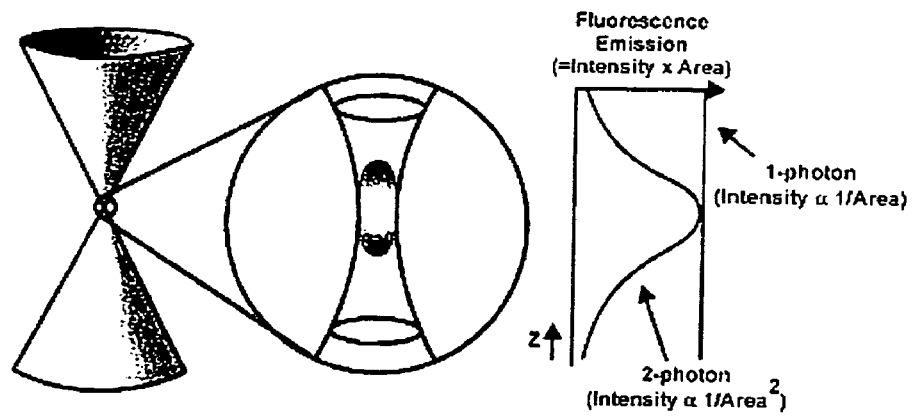
FIG. 7 shows intensity dependence of two- vs. single-photon absorption.

The quadratic dependence of two-photon excitation on incident intensity relative to single-photon excitation is illustrated in FIG. 7. The more highly localized two-photon excitation can be observed in the focal volume. The lower circle represents the diffraction limit spot made by the entering focused laser light. The cylinder of that diameter, labeled "1-photon (proportional to 1/Area) is the cylindrical volume of the diffraction limit spot in depth that represents the linear absorption intensity of the entering light, and the area-volume of product that would be made by 1-photon absorption of ultraviolet light. The Gaussian curve of FIG. 7 within the focal cylinder, "2-photon (intensity $\alpha$ 1/area$^2$)", is the distribution of light intensity squared ($I^2$). Since PAG does not absorb 1-photon light at approximately 730 nm, and does not absorb 2-photon light until $I^2$ reaches a maximum, the focal volume has decreased to the smaller area at the middle of the two cones before 2-photon absorption occurs. The inner "voxel" (volume pixel) that is formed by the diffraction limited laser spot on or in the recording medium, and the sub-diffraction limit areas of the fluorescence emitter (FE) product are formed. Using a high numerical aperture (NA) lens, spatial resolution can be maximized, but the diffraction limit cannot be surpassed except for some modifications of point-spread functions. However, the nonlinear phenomenon of two-photon absorption can be exploited to produce sub-diffraction-limit spatial resolution, on the order of approximately 120 nm using a high NA objective lens. Thus, even if the focal spot size for a given optical system (wavelength and objective lens) is larger than the diffraction limit, the diffraction limit can be exceeded provided that the photochemical processes responsible for the formation of voxels has a threshold response to excitation light intensity. The threshold is the level of light intensity above which the photochemical reactions become irreversible (e.g., permanent modification of fluorescence or refractive index). In this case, the diffraction limit becomes just a measure of focal spot size; it does not put any actual constraint on the voxel size.

Recently others reported that they have measured the voxel sizes of 2-photon-created polymer and show voxel cross-section of approximately 120 nm, compared to diffraction limit spots of approximately 500 nm. This threshold performance depends on individual photochemical reactions and will be optimized for the proposed two-photon PAG/fluorophore system. Furthermore, if confocal or adaptive optics are employed, spatial resolution on the order of 100 nm in both axial and lateral dimensions can be expected. If the voxel containing the fluorescent product of the 2-photon reaction remains sub-diffraction limit, and if it can be read out using diffraction limit readout optics, then one can achieve increased data storage by the use of closer packing of data in voxels of about 4-fold in area, which could reduce the number of layers needed for high density data storage by up to 4-fold.

The inherent three-dimensional features associated with two-photon absorption provides an excellent basis upon which to combine spatially-resolved, two-photon induced photoacid generation and fluorescence quenching with non-destructive two-photon fluorescence imaging, eliminating the need for a fixing step. A significant advantage of this approach is that solutions for optical storage can take advantage of new spatial and spectral dimensions. In addition, this multilayer approach provides optical memories that use the volume of the medium by recording data as binary (or ternary) planes stacked in 3-D. The use of transparent materials as storage media, allows for a large number of layers that can be used. The data is stored in discrete bits in the plane, but also through the volume. Relative to a one-photon-based process, much higher information densities can be obtained by writing multiple layers of bits; this is due to, first, the excitation light penetrates deeply into the material, and is absorbed only at the focal region, and secondly, Rayleigh scattering is reduced for the longer wavelengths used for two-photon excitation.

Two Photon Process Details

Figure 8:
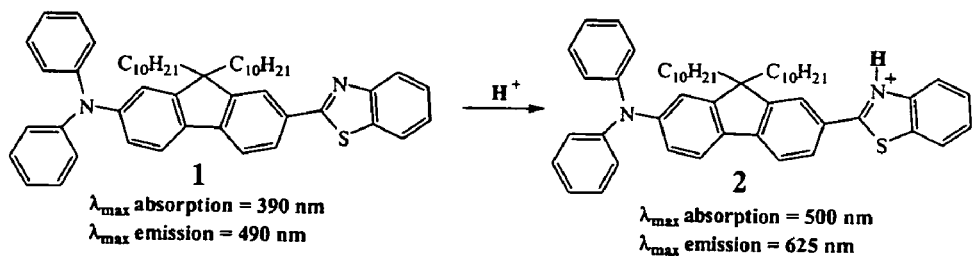
FIG. 8 shows reaction of fluorene 1 with acid, resulting in the formation of monoprotonated product 2.

FIG. 8 illustrates the chemical process yielding image formation within a photosensitive polymeric film containing PAG and an acid-sensitive fluorophore, which allows two-photon induced, dual-channel fluorescence imaging.

With the beam focused in the plane of the fluorophore-containing layer, fluorescence intensity is recorded with both channel 1 (green) and channel 2 (red) simultaneously. The contrast in the "green" channel is due to the decrease in fluorescence of fluorene 1 (whose concentration decreases with irradiation). Contrast in the "red" channel is due to the fluorescence of monoprotonated 2 (whose concentration increases with irradiation).

Figure 9:
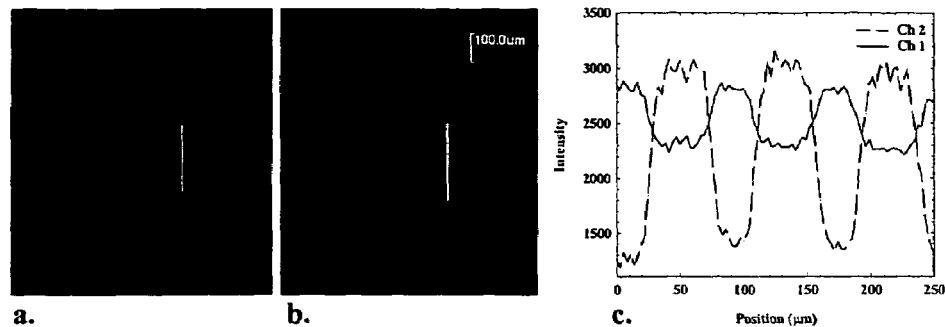
FIG. 9 (a) shows two photon fluorescent images of photosensitive films developed (via 350 nm broadband exposure, 4.4 mW/cm$^2$) using an Air Force resolution target mask which is the Image recorded by channel 1.

FIGS. 9a and 9b show films exposed using an Air Force image resolution target with images recorded by both channels. The large differences in fluorescence intensity in exposed and unexposed regions can be clearly seen in the graph (FIG. 9c) as well as the reverse parity of the images in the two channels, i.e. "positive" and "negative" image formation from one system. Time-dependent studies were performed by irradiating the films for various times to determine the optimal contrast for each detection channel.

Reported Other Approaches to Optical Data Storage

Figure 10:
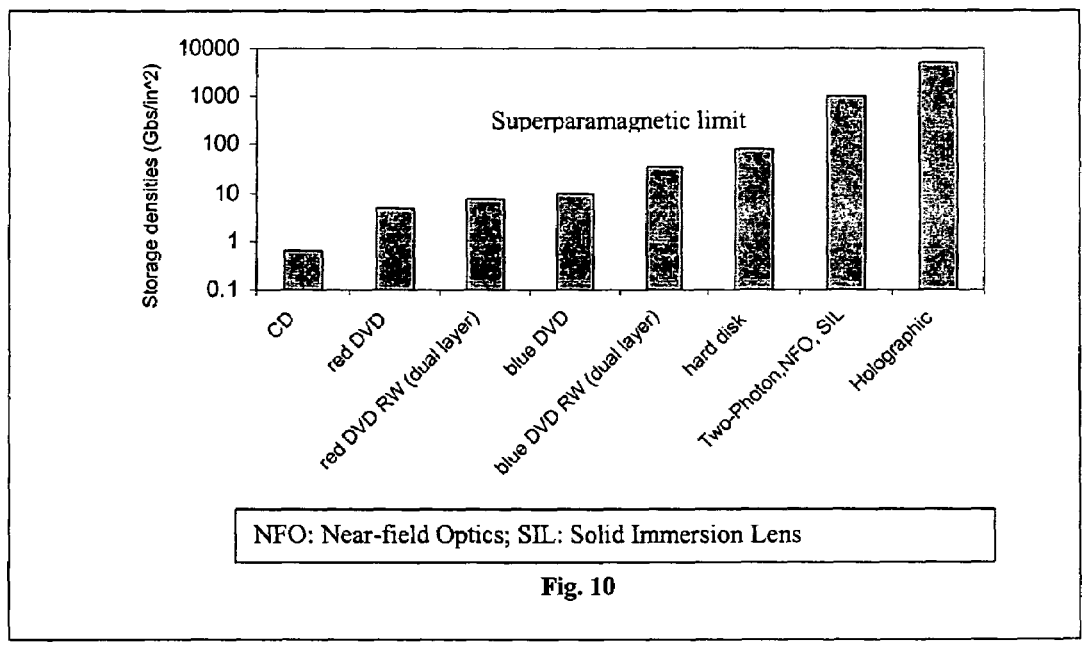
FIG. 10 shows comparison of Storage Capacities of the Current Conventional and Potential Other Optical Data Storage Technologies.

Although earlier discussed, it is reiterated that there have been several reported approaches to overcome the limitations associated with surface storage by pits in CD/DVD and magneto-optical disc technology that are currently in development. These other technologies include near-field recording, solid immersion lens frequency/time domain optical storage, spectral hole burning, photon echo memory multilayer storage with transparent materials, two photon and fluorescent memories volume storage, page oriented holographic memories and bit-oriented microholographic discs. The storage potential of these other approaches in comparison to current used technology is summarized in FIG. 10.

Traditional (CD and DVD) optical data storage discs are encoded with 2-bit (binary) "pits" on the surface, created by laser ablation (burning) of light focused on the disk surface through a DL optical system. The un-pitted area is called the "land area". In calculations made here, the "bit area" that is calculated includes the bit and land area, and a "bit width", which includes the pit and land width For readout, the bits are scanned by DL-focused "red" diode laser beam, much as in FIG. 1. If the probed bit is transparent, the light goes through the transparent disk, is reflected back from the lower mirror, and returns to the photo-detector as a "1" bit. If the bit is opaque, the detector reads a "0" bit. The reflected signal light is usually collected through the same optics that transmitted the probing spot. The encoding converts 8 bits received to 14 bit words, which insure that the binary code for "1" is separated by no fewer than two binary "0"s. A collection of approximately 8 bits creates one Byte, which is the coding element.

The ablation system is a surface process, and therefore multi-layer storage is not an option. A maximum of 2-layers (top and bottom) is possible.

From Table 1, the CD-ROM stores approximately 0.344 Gb/in2 with pit widths of approximately 1.370 µm.

From Table 1, the red DVD stores approximately 2.34 Gb/in$^2$ with pit widths of approximately 0.524 nm From Table 1, the blue DVD stores approximately 5.0 Gb/in$^2$, which is twice the storage of the red DVD, but it has 2 layers or the same storage as the red DVD per layer.

Accordingly, these disks are near the storage limit using near DL spots created by DL laser ablation and readout. The novel 2-photon-fluorescent memory system of this invention will achieve increased storage assuming DL read-in and read-out, using multi-layers, and 3-bit data encoding versus 2-bit readout.

There are two directions that can be taken in order to improve the capacity of 2-D optical storage systems. The first applies to surface storage systems and would be to increase the area storage density by surpassing the limit imposed by the diffraction of light. The second option is to add a third dimension in the spatial, spectral or time domain. This is the approach taken by the other technologies shown in FIG. 10. Adding a new dimension increases both the capacity and data transfer rates tremendously. A third dimension can be added by using multiple data layers instead of one. In two-photon technology, for example, hundreds of layers can be assembled using transparent materials as storage media. The data is recorded in binary planes stacked in 3D. On the other hand, in holographic technology information is recorded through volume. Summaries of some of the major alternative approaches that are in various stages of development are shown in the following Table 3.

TABLE 3

Comparison of some of the other approaches in optical storage with current CV/DVD technology

| Approach | Pro's | Con's | Comments |
|---|---|---|---|
| Invention Approach: Two-photon/ fluorescence | Access to multiple data layers Potential for high aerial density 500- 1000 gb/in$^2$ | Requires optimization of photosensitive media | Provides one further dimension in spatial, spectral, or time domain |
| Near field optical recording (NFOR) | Potential for very high aerial density (1000 Gb/in2) | Low optical efficiency Difficult to satisfy high data transfer requirements | Constrained to 2-D surface limitations |
| Solid immersion lens (SIL) | Higher efficiency than NFOR Potential for high aerial density of 1000 Gb/in2 | Requires extremely short working distance of lens to recording layer | SIL in combination with NFR will enable high aerial densities |
| Holographic/ micro-holographic | Potential for extremely high bit density of >1000 Gb/in2 Potential for | Media optimization required - problems with shrinkage, | Promising terabyte devices but technical hurdles have prevented its commercialization |

TABLE 3-continued

Comparison of some of the other approaches in optical storage with current CV/DVD technology

| Approach | Pro's | Con's | Comments |
|---|---|---|---|
| | very high-speed systems | scattering etc Reproducibility of object beam is a problem | |

Estimation of Number of Layers Needed to Achieve 1.0 Tbit/in² Storage Density For the foregoing Table 3, it was first estimated that the approximate number of data storage layers that would be needed to store 1 Tbit/in² of data at the storage density of the CD-ROM and the red DVD, and then it was found that one would need about >approximately 1000 layers for the CD-ROM, and about 400 layers for the red or blue DVD. In the subsequent Table 4, it shows the calculation in more detail for various storage densities up to approximately 1.0 Terabit/in², under the following assumptions:

1. The working area is approximately 14 in², assuming CD-ROM format (DVDs are at approximately 16 in²)
2. The bit widths will be approximately >520 nm, to stay above the DL of an approximately 800 nm photon focused with an approximately 1.4 NA lens.
3. The calculated bit widths include the land areas—there may be approximately 2- to approximately 5-fold error in these calculations
4. Assumed a binary (2-bit) readout, but include 3-bit (ternary) readout with (3/2)=1.5 or approximately 50% more bit information than the actual number of bits.
5. No inclusion of the extra storage realized from the small voxel bits of information that may be seen in 2-photon recording, because it is not clear that one can read these small voxels out with a DL 2-photon IR laser.

The calculations, using approximately 10 Gbites/in² in 1 and 5 layers as an example are:

Total Gbites/in²=[Total bites/in²]/(1.55×10−9(in²);
Total=approximately 10 gb/in²

Total bits/m²=approximately 1.55×10−9×Gbites/in²
Total=approximately 15.5 bits/in²

[Gbites/in²]/layer=[Total Gbites/in²]/number of layers
approximately 2 Gb/in²/layer for 5 layers

[bits/in²/layer]=Total bits/in²/number of layers
approximately 3.1 bits/in²/layer for 5 layers Bit area(in²)=approximately 1/(bits/in²); approximately 0.0645 in² for 1 layer, 0.322 in² for 5 layers

Table 4 Data Storage (Gbytes) and Data Storage Density (Gbits/in²)

Using 2-Photon Recording and Readout in Multiple Layers 20 layers can store up to approximately 75 Gbits/in²

Approximately 50 to approximately 200 layers can store approximately 100 to approximately 750 Gbits/in²

TABLE 4

| Format | Layers | Storage per CD Gbytes | Storage Density Gbites/in² | Bit Length (μ) |
|---|---|---|---|---|
| CD ROM | 1 | 0.600 | 0.344 Gbi/in² | 1370 nm |
| Red DVD | 1 | 4.7 GBy | 2.34 Gbi/in² | 0.524μ |
| 2-Photon | | | | |
| 2-bit Read | 5 | 17.5 | 10 | 0.576 |
| 3-bit Read | 5 | 26 | 15 | 0.576 |
| 2-bit Read | 10 | 35 | 20 | 0.576 |
| 3-bit Read | 10 | 52 | 30 | 0.576 |
| 2-bit Read | 50 | 175 | 100 | 0.576 |
| 3-bit Read | 50 | 260 | 150 | 0.576 |
| 2-bit Read | 300 | 1.22 TByte | 700 | 0.526 |
| 3-bit Read | 300 | 1.83 TBit | 1.050 Tbit | 0.526 |
| 2-bit Read | 500 | 1.75 TByte | 1.000 Tbit | 0.576 |
| 3-bit Read | 500 | 2.62 TBit | 1.500 Tbit | 0.576 |

Approximately 300 to approximately 500 layers are needed to store 700 to 1000 Gbits/in²

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A method of writing data in a 3-bit, 0-1-2 ternary encoding scheme for WORM (Write Once Read Many Times) optical data storage on a compact disc (CD) or digital video disc (DVD) with two-photon fluorescent readout consisting essentially of the steps of:
    (h) providing a data storage medium which is at least one of a compact disc (CD) and a digital video disc (DVD) composed of a transparent polymer selected from at least one of polystyrene, polymethylmethacrylate (PMMA) and polycarbonate, impregnated with a photo-acid generator and a stable reactive fluorene dye;
    (i) focusing a near infrared tunable Ti:Sapphire laser beam into the data storage medium with high intensity short pulses of 730 nm wavelength laser light causing the photo-acid generator to absorb the high intensity short pulses, undergo two-photon absorption and generate a proton ion ($H^+$) that is donated to the reactive fluorene dye; and
    (j) forming a stable balanced ion pair with the negative counter-ion from the photo-acid generator and the positive ion of the reactive fluorene dye wherein the stable ion pair forms a data storage voxel (volume pixel) encoding data in a 0-1-2 ternary (3-bit) data encoding scheme to achieve high data storage densities in the data storage medium.

2. A method of reading data from a 3-bit, 0-1-2 ternary encoding scheme for WORM (Write Once Read Many Times) optical data storage on a compact disc (CD) or digital video disc (DVD) with two-photon fluorescent encoded data consisting essentially of the steps of:
    (k) providing a data storage voxel (volume pixel) with 0-1-2 ternary (3-bit) encoded data in a data storage medium which is at least one of a compact disc (CD) and a digital video disc (DVD) containing a photo-acid generator (PAG), a reactive fluorene dye (RD), and a protonated fluorene dye, the fluorescence emitter (FE);

(l) exciting the fluorescence of the reactive fluorene dye (RD) and protonated fluorene dye (FE) in the data storage medium with a two-photon infrared laser light pulse of approximately 10 μs and an approximately 800 μm wavelength laser light to generate fluorescent output signals for the reactive fluorene dye (RD) and the protonated fluorene dye, the fluorescence emitter (FE);

(m) measuring fluorescent output signals each lasting for approximately 5 nanoseconds at 650 mm wavelength for the protonated fluorene dye (FE) and at approximately 530 nm wavelength for the reactive dye (RD); and (n) reading three pieces (ternary) rather than 2 pieces (binary) of information from each bit giving an advantage of 3/2 or approximately 50% more data storage from the same number of bits over a binary system.

3. A 3-bit, 0-1-2 ternary encoding scheme for WORM (Write Once Read Many Times) optical data storage on a compact disc (CD) or digital video disc (DVD) with two-photon fluorescent readout consisting essentially of:

(a) a multiple layered data storage medium which is at least one of a compact disc (CD) and a digital video disc (DVD) composed of a transparent polymer selected from at least one of polystyrene, polymethylmethacrylate (PMMA) and polycarbonate, impregnated with a photoacid generator and a stable reactive fluorene dye;

(b) the multiple layered storage medium having been subjected to high intensity short pulses from a focused near infrared tunable Ti:Sapphire laser to record data, whereby the photo-acid generator absorbs the high intensity short pulses, undergoes two-photon absorption and generates a proton ion ($H^+$) that is donated to the reactive fluorene dye causing the negative counter-ion from the photo-acid generator and the positive ion reactive fluorene dye to form a data storage voxel (volume pixel) with 0-1-2 ternary (3-bit) encoded data in a data storage medium containing a photo-acid generator (PAG), a reactive fluorene dye (RD), and a protonated fluorene dye, the fluorescence emitter (FE); and (c) a two-photon infrared laser light pulse of approximately 10 μs with approximately 800 nm wavelength laser light to excite the reactive fluorene dye (RD) and the fluorescence emitter (FE) causing each to provide fluorescent values at 530 nm wavelength and 650 nm wavelength, respectively, resulting in data readout.

4. A method for making a multilayer data storage system using a 0-1-2 ternary encoding scheme for WORM (Write Once Read Many Times) optical data storage on a compact disc (CD) or digital video disc (DVD) based on two-photon induced recording and two-photon fluorescence readout technology consisting essentially of the steps of:

(a) creating a multilayered optical disk which is at least one of a compact disc (CD) and a digital video disc (DVD) as the data storage medium cast from a transparent polymer selected from at least one of polystyrene, polymethylmethacrylate (PMMA) and polycarbonate impregnated with a photosensitive Photo-Acid Generator (PAG) and a reactive fluorene dye (RD);

(b) focusing a near infra-red tunable Ti:Sapphire laser beam into said storage medium with high intensity short pulses at 730 nm wavelength causing the photo-acid generator to undergo two-photon absorption and generate a proton ion ($H^+$) that is donated to the reactive fluorene dye causing the formation of a data storage voxel with 0-1-2 ternary (3-bit) encoded data in a data storage medium containing a photo-acid generator SAG), a reactive fluorene dye (RD), and a protonated fluorene dye, the fluorescence emitter (FE) for the data writing process;

(c) forming a multiplicity of stable balanced ion pairs from the negative counter-ion, $PAG^-$, and the positive $RD^+$, to make volume pixels corresponding to the encoded data in the storage medium;

(d) said near-IR Ti:Sapphire laser for data reading by stimulating the fluorescence of the fluorescence emitter (FE) and reactive fluorene dye (RD) with a two-photon infrared laser light pulse of approximately 10 μs and an approximately 800 nm infrared light wavelength; and, (e) reading and comparing the fluorescence output signals of the FE and RD, whereby a 3-bit, 0-1-2 ternary data-encoding scheme is realized.

5. The multilayer data storage system based on two-photon induced recording and two-photon fluorescence readout technology according to claim 4 wherein the multilayer is at least approximately 5 layers.

6. A multilayer data storage system using a 3-bit, 0-1-2 ternary encoding scheme for WORM (Write Once Read Many Times) optical data storage on a compact disc (CD) or digital video disc (DVD) based on two-photon induced recording and two-photon fluorescence readout technology consisting essentially of:

(a) a multilayered optical disk which is at least one of a compact disc (CD) and a digital video disc (DVD) as the data storage medium cast from a transparent polymer selected from at least one of polystyrene, polymethylmethacrylate (PMMA) and polycarbonate impregnated with a photosensitive Photo-Acid Generator (PAG) and a reactive fluorene dye (RD);

(b) a near infra-red tunable Ti:Sapphire laser which can be focused into said storage medium for the data writing process causing the photo-acid generator (PAC) to undergo two-photon absorption and generate a proton ion ($H^+$) that is donated to the reactive fluorene dye causing the formation of a data storage voxel (volume pixel) with 0-1-2 ternary (3-bit) encoded data in a data storage medium containing a photo-acid generator (PAG), a reactive fluorene dye (RD), and a protonated fluorene dye, the fluorescence emitter (FE);

(c) means for retuning said near-IR laser and thereby stimulating the fluorescence of the fluorescence emitter (FE) and the reactive fluorene dye (RD) with a two-photon infrared laser light pulse of approximately 10 μs with approximately 800 nm wavelength laser light for data reading; and (d) means for reading and comparing the fluorescence output signals of the FE and RD, whereby a 3-bit, 0-1-2 ternary data-encoding scheme is provided.

7. A multilayer data storage system according to claim 6 wherein the data storage medium has at least 5 layers.

8. A multilayer data storage system according to claim 7 wherein the data storage medium has approximately 5 to approximately 50 layers.

9. A multilayer data storage system according to claim 7 wherein the data storage medium has approximately 300 to approximately 500 layers.

10. A multilayer data storage system according to claim 6 wherein the data storage medium has approximately 59 to approximately 200 layers.

11. A 3-bit, 0-1-2-ternary WORM (Write Once Read Many Times) optical data storage device consisting essentially of a multilayer data disk storage system for compact disc (CD) or digital video disc (DVD) system composed of at least approximately five layers of an optically transparent polymer selected from at least one of polystyrene, polymethylmethacrylate (PPMA) and polycarbonate, impregnated with a photo-acid generator and a reactive fluorene dye.

12. The 3-bit, 0-1-2 ternary WORM (Write Once Read Many Times) optical data storage device according to claim 11 wherein the data storage medium has from approximately five to approximately fifty layers of said transparent impregnated polymer.

13. The 3-bit, 0-1-2 ternary WORM (Write Once Read Many Times) optical data storage device according to claim 11 wherein the data storage medium has from approximately fifty to approximately two hundred layers of said optically transparent impregnated polymer.

14. The 3-bit, 0-1-2 ternary WORM (Write Once Read Many Times) optical data storage device according to claim 11 wherein the data storage medium has from approximately three hundred to approximately five hundred layers of said optically transparent impregnated polymer.

15. The 3-bit, 0-1-2 ternary WORM (Write Once Read Many Times) optical data storage device according to claim 11 wherein the bit length is approximately 0.576µ.

* * * * *